(12) United States Patent
Imaki et al.

(10) Patent No.: US 7,239,654 B2
(45) Date of Patent: Jul. 3, 2007

(54) WAVE LENGTH PLATE, WAVELENGTH FILTER AND WAVELENGTH MONITOR

(75) Inventors: Masao Imaki, Tokyo (JP); Syuhei Yamamoto, Tokyo (JP); Youhei Mikami, Tokyo (JP); Yoshihito Hirano, Tokyo (JP); Makoto Satou, Tokyo (JP); Kenji Masuda, Tokyo (JP); Yasunori Nishimura, Tokyo (JP); Yuji Masuyama, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 10/250,454

(22) PCT Filed: Oct. 31, 2002

(86) PCT No.: PCT/JP02/11364

§ 371 (c)(1),
(2), (4) Date: Dec. 12, 2003

(87) PCT Pub. No.: WO03/038484

PCT Pub. Date: May 8, 2003

(65) Prior Publication Data

US 2004/0094698 A1 May 20, 2004

(30) Foreign Application Priority Data

Nov. 1, 2001 (JP) ............................ 2001-336583

(51) Int. Cl.
*H01S 3/10* (2006.01)
(52) U.S. Cl. ...................... 372/21; 372/22; 372/44.011
(58) Field of Classification Search ............. 372/29.02, 372/21, 22, 44.011
See application file for complete search history.

(56) References Cited

U.S. PATENT DOCUMENTS 4,968,881 A * 11/1990 Takahashi et al. ........ 250/231.1
6,047,009 A * 4/2000 Adachi et al. ................ 372/21

FOREIGN PATENT DOCUMENTS

EP 1 182 436 A1 * 2/2002

(Continued)

OTHER PUBLICATIONS

Tatsuya Kimura et al., "Temperature Compensation of Birefringent Optical Filters," Proceedings of the IEEE, Aug. 1971, pp. 1273-1274.
"Laser Optics, Coatings, Crystals and Cavities," Brochure of VLOC, pp. 8-13, USA.

(Continued)

*Primary Examiner*—Dung T. Nguyen
(74) *Attorney, Agent, or Firm*—Buchanan Ingersoll & Rooney PC

(57) ABSTRACT

On a plate of birefringent crystal made of an $LiNbO_3$ crystal or an $LiTaO_3$ crystal, a conductive substance is adhered to the whole periphery of side surfaces of the plate that intersect an incident surface of a laser beam, thereby to form a wave plate. A polarizer is provided at the latter stage of the wave plate. A wavelength is monitored based on an output from the polarizer. With this arrangement, based on the use of the $LiNbO_3$ crystal or the $LiTaO_3$ crystal that can be manufactured by a large quantity at low cost, it is possible to obtain polarization characteristics and wavelength discrimination characteristics that are stable against environmental changes such as temperature and external stress, by suppressing the pyroelectric effect and the piezoelectric effect of these materials.

26 Claims, 6 Drawing Sheets

(A)

(B)

(C)

FOREIGN PATENT DOCUMENTS

| | | |
|---|---|---|
| JP | 57-196166 | 12/1982 |
| JP | 62-73207 | 4/1987 |
| JP | 2001-244557 | 9/2001 |
| WO | WO 01/57487 A1 * | 8/2001 |

OTHER PUBLICATIONS

Unpublished U.S. Appl. No. 10/477,113, Yasunori Nishimura et al., "Wavelength Monitor, Optical Module, and Optical Module Packaging Method", Filed Nov. 7, 2003.

* cited by examiner (a)

(b)

WAVE LENGTH PLATE, WAVELENGTH FILTER AND WAVELENGTH MONITOR

This application is a National Stage filing of a PCT Application bearing Application Number PCT/JP02/11364, filed on Oct. 31, 2002, which claims priority to a Japanese Patent Application No. 2001-336583, filed on Nov. 1, 2001, which applications are incorporated herein by reference.

TECHNICAL FIELD

The present invention relates to a wave plate, a wavelength filter, and a wavelength monitor.

BACKGROUND ART

Dense Wavelength Division Multiplexing (hereinafter, "DWDM") Technology, which employs a single optical fiber with optical signals each having different wavelength in place of a plurality of optical fibers, have proceeded over the past few years. In the systems that employ the DWDM technology (hereinafter, "DWDM systems"), one wavelength is assigned a band of a few gigabits (Gbits), and the single optical fiber makes it possible to communicate through a few dozens of wavelengths (i.e., a few hundred gigabits). The DWDM systems require higher stability with narrow spacing between the wavelength bands, to multiplex the optical signals in each of different wavelength bands in high density. An optical communication device applied to the DWDM systems employs a semiconductor module that outputs an optical signal having a specific wavelength band from a laser diode (hereinafter, "semiconductor laser"). The wavelength division multiplexing on the DWDM systems is realized by multiplexing beams, which are output from a plurality of semiconductor modules each having different emission wavelength bands, in one optical fiber.

This type of semiconductor module is disclosed in, for example, Japanese Patent Application Laid-open No. 2001-244557. The application, specifically, discloses, monitoring a wavelength of a beam emitted from the rear side of the semiconductor laser, adjusting a current injected to the semiconductor laser and a temperature to stabilize an emission wavelength of the semiconductor laser within a specific wavelength band, and thereby controlling the emission wavelength.

It is generally known that the emission wavelength of the semiconductor laser increases with an increase in the injection current for high beam power. It is also known that the wavelength changes depending on a temperature, and the emission wavelength increases with an increase in the temperature. The application also discloses a technique of monitoring an emission wavelength of a semiconductor laser using a birefringent crystal that has an optical anisotropy in which refractive indexes thereof differ depending on polarization directions of an input laser beam. The birefringent crystal is provided with a high reflection coating on both end surfaces thereof. In the application, moreover, the use of two crystals to cancel a change of a refractive index depending on a temperature of the birefringent crystal is disclosed. One crystal is a $YVO_4$ crystal whose refractive index increases with an increase in a temperature thereof, and the other crystal is a $\beta$-$BaB_2O_4$ crystal whose refractive index decreases with an increase in a temperature thereof.

"Temperature Compensation of Birefringent Optical Filter, Kimura et al, the proceedings of IEEE, August 1971, pp. 1273-1274" also discloses an optical filter that employs two birefringent crystals. FIG. 1 shows a structure of this optical filter. The optical filter consists of a first polarizer 51, a $CaCO_3$ crystal 52, an $LiTaO_3$ crystal 53, and a second polarizer 54.

The first polarizer 51 transmits only a linearly polarized beam. The linearly polarized beam is inclined by 45 degrees from a horizontal axis direction on a plane that is perpendicular to an incident light axis direction. The $CaCO_3$ crystal 52 has a fast axis in a plane that is perpendicular to an incident light. The $LiTaO_3$ crystal 53 has a slow axis in a plane that is perpendicular to the incident light. The second polarizer 54 transmits only a linearly polarized beam in a polarization direction that is the same as the first polarizer. The fast axis refers to an axis direction in which a refractive index is the lowest on the plane that is perpendicular to an optical axis of the birefringent crystal. The slow axis refers to an axis that is perpendicular to the fast axis.

As a result, a laser beam is incident on the first polarizer 51. The laser beam that has passed through the first polarizer 51 has only the component inclined by 45 degrees from the horizontal axis direction on the plane that is perpendicular to the optical axis direction. Therefore, the polarized beam inclined by 45 degrees with respect to the crystal axes of the $CaCO_3$ crystal 52 and the $LiTaO_3$ crystal 53 is sequentially incident on the crystal. The $CaCO_3$ crystal 52 and the $LiTaO_3$ crystal 53 give different phase shifts to the incident laser beam that pass through these crystals. The second polarizer 54 transmits only the polarization component that is the same as the polarized beam that has been transmitted from the first polarizer 51. Since the phase shifts given in the crystals 52 and 53 have wavelength dependency, the intensity of the laser beam that has passed through the second polarizer 54 also has wavelength dependency.

However, the wavelength of the laser beam that has passed through the second polarizer 54 is not easily changed by a temperature change. This is because the $CaCO_3$ crystal 52 and the $LiTaO_3$ crystal 53 have such lengths $l_1$ and $l_2$ respectively that respective phase shift quantities $\delta$ are cancelled each other with respect to a temperature change. Concretely, the shift quantities and the shift directions of the length $l_1$ and $l_2$ are designed.

The $LiTaO_3$ crystal 53 is a birefringent crystal material that can be manufactured in a large quantity at low cost. The inventors have previously proposed, in Published International Application WO 01/5787A1, a method of monitoring an emission wavelength of a semiconductor laser, by using an $LiNbO_3$ crystal that is a birefringent crystal material that can be manufactured in a large quantity at low cost, like the $LiTaO_3$ crystal 53. The proposed method describes that a wavelength filter is structured using the $LiNbO_3$ crystal having typical two characteristics. One characteristic is that refractive indexes of the $LiNbO_3$ crystal are different depending on an axis azimuth based on the optical anisotropy of the $LiNbO_3$ crystal. The other characteristic is that a polarization state of a laser beam that has passed through the $LiNbO_3$ crystal changes depending on the wavelength of the laser beam. As a result, this method makes it possible to monitor the emission wavelength of the semiconductor laser by detecting the polarization state of the laser beam that has passed through the $LiNbO_3$ crystal as the birefringent crystal. In the proposed method, moreover, a combination of two crystals is employed. One crystal is the $YVO_4$ crystal whose refractive index increases with an increase in a temperature thereof. The other crystal is the $LiNbO_3$ crystal whose refractive index decreases along an increase in a crystal temperature. As a result, the combination makes it possible to cancel a change of a refractive index relative to a temperature change of those birefringent crystals.

The inventors, however, have found the following problems of the proposed method by an experiment. The wavelength filter has the combination so as to cancel the change of the refractive index relative to a temperature change. However, a phase shift relative to the temperature change remains depending on a birefringent crystal material that is employed in the combination. This remaining phase shift gives an influence that cannot be disregarded to the monitoring of a wavelength.

In other words, even when a laser beam that is stably emitted with a wavelength (reference wavelength) to be controlled is incident on the wavelength filter, the wavelength of the beam after passing through the wavelength filter varies due to a change in the temperature. In this experiment, the inventors have used the $LiNbO_3$ crystal as one of the birefringent crystals that constitute the wavelength filter. The thickness of the $LiNbO_3$ crystal in a propagation direction of the laser beam is extremely small as compared with the size of the plane on which the laser beam is incident. However, pyroelectricity of the $LiNbO_3$ crystal leads to a change of the phase shift quantity δ, and therefore the wavelength discrimination characteristic of the wavelength filter changes from a temperature change and an external stress. It is not possible to disregard this change in monitoring the emission wavelength of the semiconductor laser in high precision. Moreover, the pyroelectricity causes piezoelectric effect, and this piezoelectric effect further leads to an increase in the change of the phase shift quantity δ.

Japanese Patent Application Laid-open No. 62-73207 discloses an example of the application of the $LiNbO_3$ crystal to an optical waveguide device. A change in temperature of the optical waveguide leads to the result that pyroelectricity of a substrate made of the $LiNbO_3$ crystal changes a state of electric polarization. Therefore, a charge is accumulated on the surface of the substrate. Corresponding to the accumulated charge, the opposite polarity of charge is induced on the bottom surface of an electrode. A refractive index of the waveguide is changed by applying an electric field to between the electrode and the counter electrode. A modulation operation of the optical waveguide device is realized by this changes in the refractive index.

However, when a charge occurs within the waveguide due to a change in the temperature, modulation characteristics change significantly over the waveguide length. The Japanese Patent Application describes that it is possible to suppress the change in the modulation characteristics resulting from the temperature change, in the following manner. An ITO (Indium Tin Oxide) film is coated on the surface of the substrate over the waveguide length so that charge distribution on the surfaces of the electrodes and the surface between the electrodes is uniform. This uniform charge distribution prevents the generation of an electric field that is directed from between the electrodes to one electrode, and suppresses a change in the modulation characteristics resulting from the temperature change.

However, the charge accumulated on the surface of the $LiNbO_3$ substrate is not localized but is accumulated uniformly. Therefore, refractive index variation occurs due to the electro-optic effect. While the ITO film induces a charge on the surface thereof, this substance is relatively expensive in general, and it has been relatively difficult to handle the coating and the like.

As other birefringent crystal material, an $SiO_2$ crystal is generally used, as described in a brochure of U.S. VLOC Incorporated, titled "LASER OPTICS, COATINGS, CRYSTALS AND CAVIIES", pp. 9-13 (issued by VLOC). This $SiO_2$ crystal is obtained only as a natural substance, and is expensive. Therefore, it is difficult to produce a large number of the $SiO_2$ crystal.

The conventional wavelength filter is structured as explained above. While two birefringent crystals are employed to cancel a change in the refractive index resulting from a temperature change, pyroelectric materials are used for the birefringent crystals. Therefore, the pyroelectric effect occurs, and the piezoelectric effect occurs following the pyroelectric effect. Consequently, there is a problem that these effects give an influence that cannot be disregarded to improving the precision of the wavelength discrimination characteristics.

According to the conventional optical waveguide device that employs the pyroelectric material, the ITO film is coated on the surface on which the electrode is disposed, and therefore a charge does not exist on the surface locally. However, a charge is uniformly accumulated on the surface of the substrate, which also generates a change in the refractive index. While the ITO film is employed to induce a charge on the surface, ITO is expensive in general, and it is relatively difficult to handle the coating and the like.

To solve the problems, it is an object of the present invention to provide a wave plate and a wavelength filter that employ a birefringent crystal, such as the $LiNbO_3$ crystal or the $LiTaO_3$ crystal that can be manufactured in a large quantity at low cost, that suppress the pyroelectric effect and the piezoelectric effect of these crystals, and that have polarization characteristics and wavelength discrimination characteristics that are stable against changes in the environment such as temperature and external stress. It is another object of this invention to provide a wavelength monitor that employs the wave plate or the wavelength filter.

DISCLOSURE OF THE INVENTION

The wave plate according to the present invention is made of any one of an $LiNbO_3$ crystal and an $LiTaO_3$ crystal, and has a plurality of side surfaces; and a conductor that is arranged on the side surfaces, wherein the side surfaces intersect an incident surface on which a laser beam is incident.

The wave plate according to the next invention is made of an $LiNbO_3$ crystal or an $LiTaO_3$ crystal, and has a plurality of surfaces; and a conductor that is arranged on the surfaces, wherein the surfaces intersect an optical axis of the wave plate.

The wave plate according to the next invention is made of an $LiNbO_3$ crystal or an $LiTaO_3$ crystal, and includes two surfaces where a laser beam passes through and a plurality of side surfaces that intersect the two surface; an anti-reflection coating that is arranged on any one of the two surfaces; and a conductor that is arranged on the side surfaces.

The wavelength filter according to the next invention includes: the wave plate; and a polarizer that is disposed on an optical path of a laser beam passing through the wave plate.

The wavelength monitor according to the next invention includes: the wave plate; a photodetector that is disposed on an optical path of a laser beam passing through the wave plate, and that outputs a signal corresponding to the laser beam; and a polarizer that is disposed between the wave plate and the photodetector on the optical path.

The wavelength monitor according to the next invention includes: a semiconductor laser; the wave plate through which a laser beam output from the semiconductor laser passes; a photodetector that is disposed on an optical path of the laser beam passing through the wave plate, and that outputs a signal corresponding to the laser beam; and a polarizer that is disposed between the wave plate and the photodetector on the optical path.

The wavelength monitor according to the next invention includes: a semiconductor laser; the wave plate through which a laser beam output from the semiconductor laser passes; a first photodetector that is disposed on an optical path of the laser beam passing through the wave plate, and that outputs a signal corresponding to the laser beam on the optical path; a second photodetector that is disposed on other optical path of the laser beam passing through the wave plate, and that outputs a signal corresponding to the laser beam on the other optical path; and a polarizer that is disposed on the optical path between the wave plate and the first photodetector, and that is disposed with a deviation from the other optical path between the wave plate and the second photodetector.

The wavelength monitor according to the next invention includes: a semiconductor laser; the wave plate through which a laser beam output from the semiconductor laser passes; a photodetector that is disposed on an optical path of the laser beam passing through the wave plate, and that outputs a signal corresponding to the laser beam; a polarizer that is disposed between the wave plate and the photodetector on the optical path; and a controller that adjusts any one of a temperature of the semiconductor laser, a temperature of a mount on which the semiconductor laser is mounted, and an injection current to the semiconductor laser, based on the signal output from the photodetector.

BEST MODE FOR CARRYING OUT THE INVENTION

Figure 1:
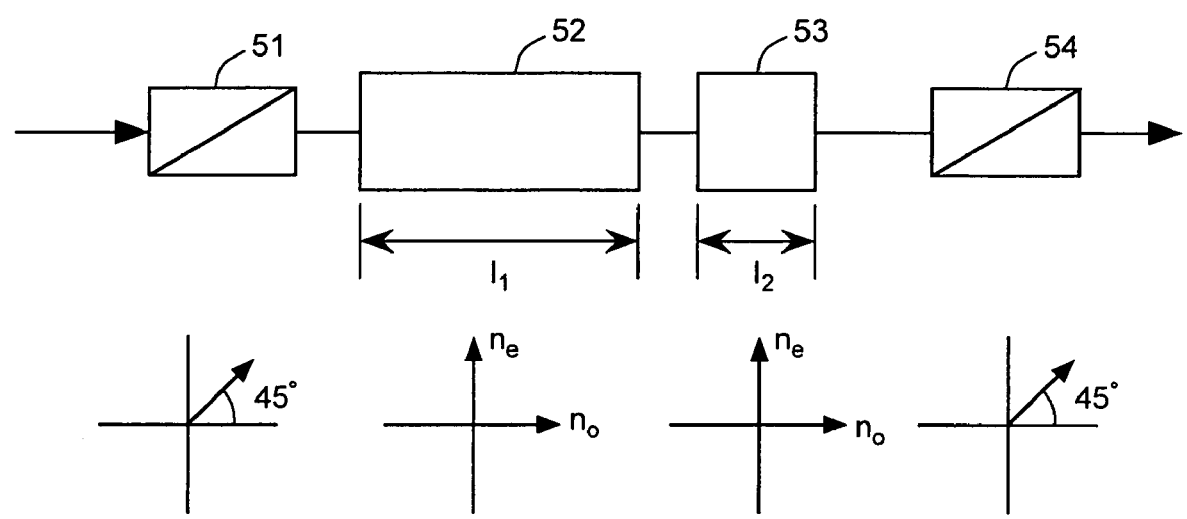
FIG. 1 shows a structure of a conventional optical filter.

Exemplary embodiments of the wave plate, the wavelength filter, and the wavelength monitor according to the present invention will be explained in detail below with reference to the accompanying drawings.

In a first embodiment, a wavelength filter includes a wave plate made of a birefringent crystal material. The wave plate also causes, when a linearly polarized laser beam which has two orthogonal components passes through the wave plate, a phase shift between the components to the laser beam. Precisely, this wave plate has optical anisotropy in which refractive indexes thereof differ depending on the axis azimuth. Given three orthogonal axes for a birefringent crystal, if the birefringent crystal has a uniaxial anisotropy, a refractive index along a specific axis of the birefringent crystal is different from those of the other two axes. In general, this specific axis is called an optical axis (hereinafter, "c axis"). This birefringent crystal has a fast axis and a slow axis that face mutually orthogonal directions on a plane that is perpendicular to an incident direction of the laser beam. The fast axis has a small refractive index for a polarized beam in the direction thereof, and has a fast phase velocity. On the other hand, the slow axis has a large refractive index for a polarized beam in the direction thereof, and has a slow phase velocity. In other words, the component parallel to the slow axis lags the one parallel to the fast axis. Therefore, when a laser beam having both orthogonal polarization components is incident on the birefringent crystal, the laser beam is output from the birefringent crystal with a phase shift δ between the components. As a result, the polarization direction of the laser beam rotates. The phase shift quantity δ is given as $\delta = 2\pi (n_e - n_o) L/\lambda$, where λ is a wavelength of a laser beam, $n_e$ is a refractive index of the polarized beam along the fast axis of the uniaxial birefringent crystal, $n_o$ is a refractive index of the polarized beam along the slow axis, and L is a thickness of the birefringent crystal in a passing direction of an incident laser beam. Thus, the phase shift quantity δ becomes a function of the wavelength λ. A wave plate having δ=¼π it and a wave plate having δ=½π it are called a quarter-wave plate and a half-wave plate respectively. These wave plates can be adjusted to transmit an incident beam in a desired polarization direction, and therefore they are widely used as polarized beam control elements. An $LiNbO_3$ crystal (hereinafter, "LN crystal") that can be manufactured in a large quantity at low cost is employed for the wave plate. Since this crystal has pyroelectricity, it is necessary to apply a conductive material to the surrounding of the wave plate in order to reduce the influence of the pyroelectricity that is generated from a temperature change.

In the first embodiment, a polarizer is disposed at the subsequent stage of the wave plate in the incident direction of a laser beam. The wavelength filter causes the laser beam to change the light intensity depending on the wavelength of the laser beam in cooperated with this polarizer.

Details of the wavelength filter of the first embodiment according to the present invention will be explained with reference to the drawings.

Figure 2:
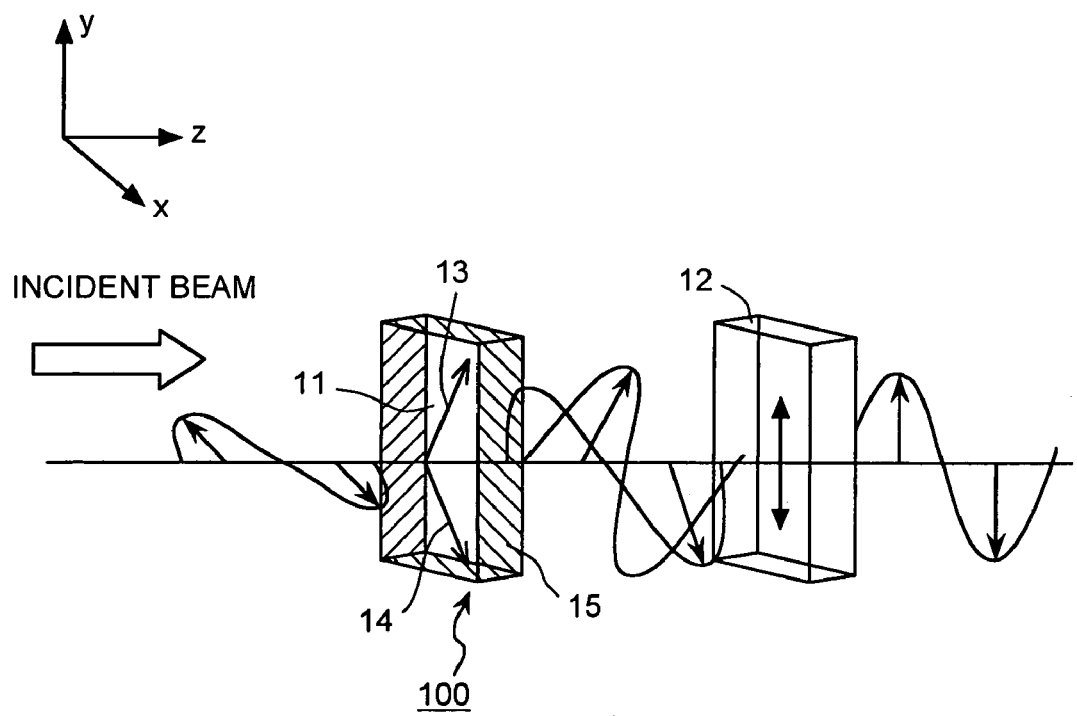
FIG. 2 shows a structure of a wavelength filter of a first embodiment according to the present invention.
Figure 3:
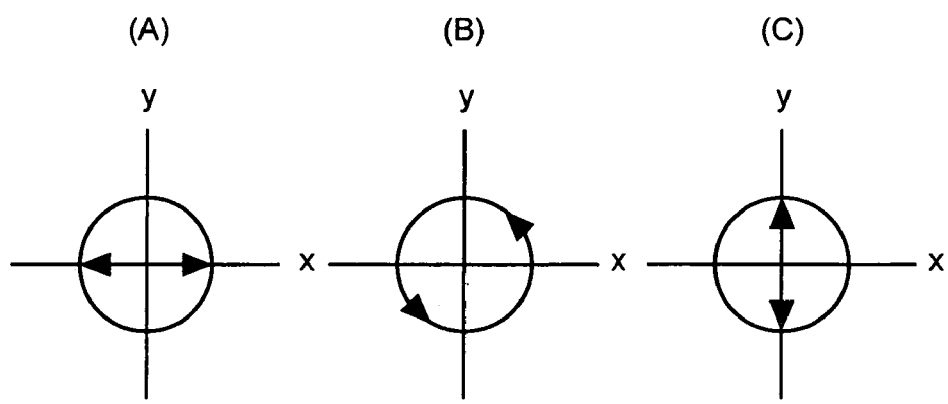
FIG. 3 shows an example of a change in a polarization state of a beam that passes through the wave plate of the first embodiment according to the present invention.

FIG. 2 shows a structure of the wavelength filter of the first embodiment according to the present invention. FIG. 3 shows a polarization state of a laser beam before and after the laser beam is incident on the wavelength filter shown in FIG. 2. The following explanation is made based on a rectangular coordinate system of x, y and z axes shown in FIG. 2. The direction of the laser beam in the spatial coordinate, that is, the optical axis direction, is defined as the z axis. The vertical direction in the spatial coordinate is defined as a y axis. The direction that is orthogonal to both the z axis and the y axis, that is, the horizontal direction in the spatial coordinate, is defined as the x axis.

The wavelength filter in FIG. 2 includes a wave plate 100 and a polarizer 12. The wave plate 100 has a conductive adhesive 15 coated on side surfaces of an LN crystal 11 having the uniaxial anisotropy. An anti-reflection (hereinafter, "AR") coating is provided on an incident surface on which the laser beam is incident and an outgoing surface of which the laser beam passes out. The incident and outgoing surface form planes perpendicular to the z axis of the wave plate 100. Those surfaces make is possible to prevent reflection and multiple reflection of the laser beam inside the wave plate 100.

The LN crystal 11 has the thickness in the incident direction (z axis direction) of the laser beam not more than one tenth of a length (size of plane in x and y directions) of the incident surface. For example, for the LN crystal 11, a crystal plate is employed that is cut in a hexahedron that has approximately 2.5 mm side in the x axis direction, approximately 2.4 mm length in the y axis direction, and approximately 0.15 mm thickness (plate thickness) in the z axis direction. The LN crystal 11 is disposed such that a plane including a c axis 13 of the LN crystal 11 and an axis orthogonal with the c axis (hereinafter, "a axis") 14 is parallel to the x-y plane. In other words, the plane is parallel to the incident and outgoing surfaces.

Further, the LN crystal 11 is disposed such that the c axis 13 and the a axis 14 are inclined by 45 degrees respectively from the polarization direction of the incident laser beam. Within the LN crystal 11, the component of the incident laser beam in the c axis direction is in the direction of the slow axis that has a slow phase velocity and a high refractive index. The component of the incident laser beam in the a axis direction is in the direction of the fast axis that has a fast phase velocity and a low refractive index. The refractive index $n_e$ of the LN crystal 11 in the c axis direction is approximately 2.2114, and the refractive index $n_o$ in the a axis direction is approximately 2.1383.

The conductive adhesive 15 is, for example, ECCO-BOND (a trademark of National Starch And Chemical Company) 56C provided by Emerson & Cuming. The ECCOBOND 56C is a silver-color and includes silver (Ag) paste by approximately 70%. This conductive adhesive 15 is also coated on side surfaces of the LN crystal 11 parallel to the z axis direction, in the thickness not to expose the crystal surface, as shown by a hatched portion in the drawing. The conductive adhesive 15 may be any other conductive adhesive that can make conductive the charge polarized in positive and negative by being coated on the side surfaces of the LN crystal 11.

At least one of the side surfaces parallel to the z axis direction of the wave plate 100 is fixedly held with a metal holding member, not shown. While the inventors design this wave plate 100 such that the right end of the wave plate 100 in FIG. 2 is held, as an example, it is also possible to hold any one of the four side surfaces of the wave plate 100. For the holding member, it is preferable to use a material whose coefficient of linear expansion is approximate to that of the LN crystal 11.

The polarizer 12 transmits only the beam component polarized in the y axis direction, and absorbs or reflects the beam component polarized in the x axis direction orthogonal with the y axis direction.

A laser beam is incident on the wavelength filter including the wave plate 100 and the polarizer 12, in the z axis direction shown in FIG. 2. FIG. 3 shows a polarization state of a laser beam before and after the laser beam is incident on the wavelength filter. FIG. 3(A) shows a polarization state of the laser beam that is incident on the wave plate 100, (B) shows one example of a polarization state of the laser beam that passes through the wave plate 100, and (C) shows a polarization state after the laser beam passes through the polarizer 12.

A laser beam having the polarization state shown in FIG. 3(A) is incident on the wave plate 100 along the direction of the arrow mark (incident beam) shown in FIG. 2. Of the laser beam input to the wave plate 100, the beam component polarized parallel to the a axis leads the one polarized parallel to the c axis direction in phase. Therefore, the polarization state of the laser beam changes when the laser beam passes through the wave plate 100. The change of the polarization state is attributable to the phase shift between the components. The phase shift quantity δ is expressed as $δ=2π\Delta n L/λ$, where λ is a wavelength of the laser beam, Δn is a difference (hereinafter, "refractive index difference") between the refractive index in the c axis direction and the refractive index in the a axis direction, and L is a length of the wave plate 100 in the laser beam propagation direction.

Intensity Ip of the laser beam that passes through the polarizer 12 is obtained from the phase shift quantity δ. When the polarizer 12 has characteristics of transmitting only the beam component polarized in the y axis direction and when the c axis direction of the wave plate 100 is inclined by 45 degrees from the x axis direction, the Ip becomes the square of sin (δ/2). When the polarizer 12 has characteristics of transmitting only the beam component polarized in the x axis direction, the Ip becomes the square of cos (δ/2). Therefore, the phase shift quantity δ depends on the wavelength λ, and the intensity Ip of the beam that passes through the polarizer 12 is determined by the λ. Consequently, by measuring the intensity Ip of the beam that passes through the polarizer 12, it is possible to obtain characteristics based on the wavelength dependency, that is, the wavelength discrimination characteristics.

The transmission intensity of the polarizer 12 also depends on the environmental temperature and the external stress. The LN crystal 11 affect the wavelength discrimination characteristics, since the refractive index difference Δn and the length L change depending on the pyroelectricity and the piezoelectric effect. The pyroelectricity refers to a phenomenon that spontaneous electric polarization within the crystal changes due to a change in the crystal temperature, and charge is accumulated on the surface of the crystal. When the charge is accumulated on the surface because of the pyroelectricity, the refractive index of the crystal changes. That is, the Δn changes due to the electro-optic effect. The piezoelectric effect refers to a phenomenon that an electric field is generated from a distortion resulting from an external stress. The electric field generated by the piezoelectric effect causes the refractive index difference Δn of the crystal to change, like the pyroelectric effect. This piezoelectric effect is emphasized by the change in the refractive index.

The holding member fixes the wave plate 100 at one surface thereof, as described above. Therefore, a change in temperature causes a distortion in the periphery of the portion where the LN crystal 11 fixed by the holding member, because of the difference between the coefficient of linear expansion of the LN crystal 11 as the wave plate 100 and that of the holding member. This distortion induces the pyroelectric effect and the piezoelectric effect. Both effects generate an electric field in the crystal and accumulate charge, which becomes a factor of changing the refractive index difference Δn of the crystal. Particularly, the electro-optic effect is large in the c axis direction, and causes a large refractive index variation between both side surfaces that sandwich the c axis direction.

However, in the first embodiment, since the conductive adhesive 15 is coated on the side surfaces of the LN crystal 11, the side surfaces are conductive, and charge is not accumulated on the surface of the LN crystal 11. Therefore, in the wave plate 100, the pyroelectricity and the piezoelectric effect do not give influences to the refractive index Δn and the length L. Consequently, it is possible to obtain wavelength discrimination characteristics of high stability not affected by the environmental changes.

The LN crystal 11 is formed such that the LN crystal 11 has side surfaces that the c axis 13 and the a axis 14 intersect. Therefore, polarized charges generated by the pyroelectricity and the piezoelectric effect are accumulated in concentration on these side surfaces. Only a slight charge appears on the incident surface and the outgoing surface of the LN crystal 11. The plate thickness of the LN crystal 11 is a negligible size of about one tenth of one length of the incident surface. Therefore, by coating the conductive adhesive on only the side surfaces of the LN crystal 11 without the incident surface, it is possible to sufficiently suppress the influences of the pyroelectricity and the piezoelectric effect.

In the first embodiment, the conductive adhesive 15 is coated on the whole periphery of the side surfaces of the LN crystal 11 of the wave plate 100. It is also possible to coat the conductive adhesive 15 on the side surfaces of the LN crystal 11 to make conductive a corner that sandwiches the c axis direction as shown in FIG. 4(a). FIG. 4(b) is a view of the structure shown in FIG. 4(a) observed from the z axis direction. The conductive adhesive 15 is adhered to side surfaces L1 and L2 that continuously connect between two intersection points A and B at which the c axis 13 intersects the side surfaces of the LN crystal 11 (hatched portions in FIG. 2). The polarized charge is concentrated at the periphery of the intersection points A and B. Therefore, it is preferable that the conductive adhesive 15 is coated on a portion h that is a part of the side surface L3 at the side surface L1 side and that faces the side surface L2, and a portion g that is a part of a side surface L4 at the side surface L2 side and that faces the side surface L1. In this case, it is particularly possible to suppress the charge accumulation in the c axis direction that has a large electro-optic effect. Consequently, there is a remarkable effect of suppressing the refractive index variation as compared with when the conductive adhesive 15 is not coated. When the birefringent crystal gives the electro-optic effect particularly to the a axis direction, the conductive adhesive 15 may be coated to make conductive the corner that sandwiches the a axis direction.

In the first embodiment, the conductive adhesive 15 is coated as means for making the side surfaces of the LN crystal 11 conductive. It is also possible to make the side surfaces of the LN crystal 11 conductive by providing a metallize coating on the side surfaces based on a deposition of Ni—Au. It is also possible to obtain a similar effect when the LN crystal 11 is grounded.

In the first embodiment, while the LN crystal 11 is used for the wave plate 100 that constitutes a wavelength filter, it is also possible to employ the LiTaO$_3$ crystal having the same pyroelectric characteristics. The LiTaO$_3$ crystal also makes it possible to take a similar effect when the side surfaces parallel to the z axis are made conductive. The LN crystal 11 may have not the quadrangle plate shape but the other plate shape having wavelength filtering characteristics, for example, a pentagonal plate shape or a round plate shape.

Figure 5:
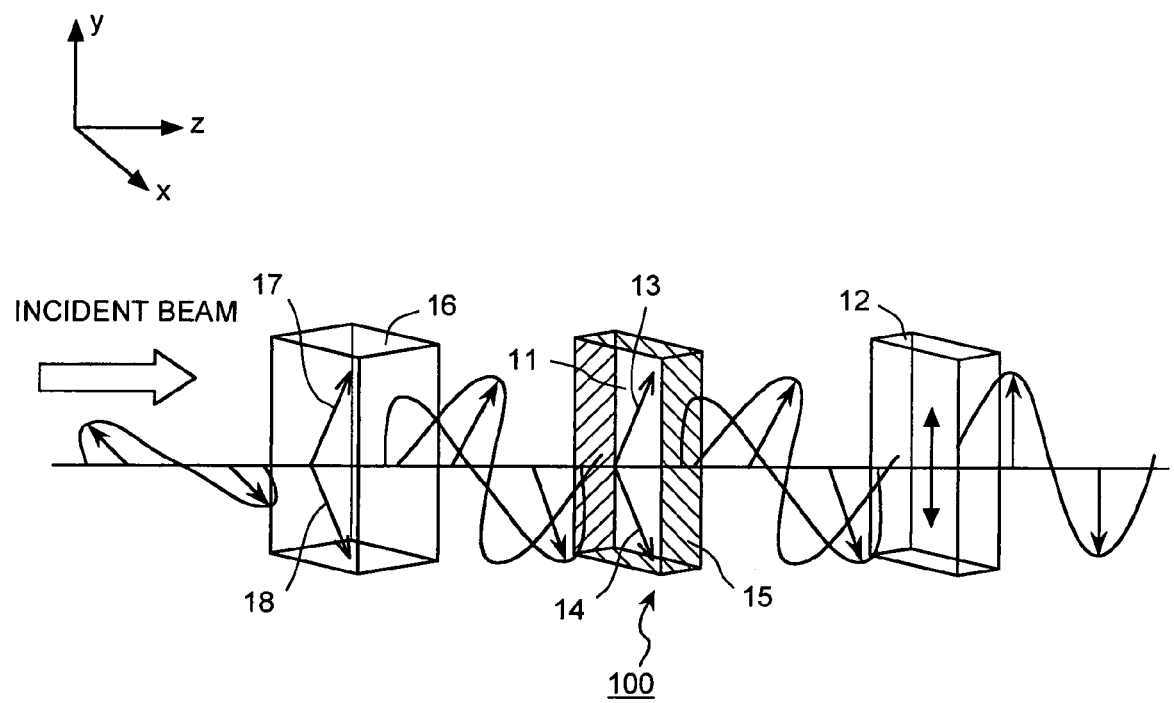
FIG. 5 shows a structure of a wavelength filter of a second embodiment according to the present invention.

FIG. 5 shows a structure of a wavelength filter of a second embodiment according to the present invention. This wavelength filter includes a YVO$_4$ crystal 16 made of a birefringent crystal material as a second wave plate. The YVO$_4$ crystal 16 is disposed, in the structure shown in FIG. 2, between a semiconductor laser, not shown, as a light source of a laser beam and the LN crystal 11. Other constituent elements are identical or equivalent to those attached with like reference numerals shown in FIG. 2, and therefore, their explanation will be omitted.

The YVO$_4$ crystal 16 has uniaxial optical anisotropy, and has a c axis 17 and an a axis 18 that cross at right angles, like the LN crystal 11. The YVO$_4$ crystal 16 is disposed such that a plane including the c axis 17 and the a axis 18 of the YVO$_4$ crystal 16 is parallel to the x-y plane. In other words, the plane is parallel to the incident and outgoing surfaces of the YVO$_4$ crystal 16.

Further, the YVO$_4$ crystal 16 is disposed such that when the polarization direction of the incident laser beam is parallel to the x axis direction, the c axis 17 is inclined from the polarization direction (x axis direction) by 45 degrees on the x-y plane. Therefore, the a axis 18 of the YVO$_4$ crystal 16 is also inclined from the polarization direction by 45 degrees on the x-y plane. Within the YVO$_4$ crystal 16, the component of the incident laser beam in the c axis direction 17 is in the direction of the slow axis that has a slow phase velocity and a high refractive index. The component of the incident laser beam in the a axis 18 direction is in the direction of the fast axis that has a fast phase velocity and a low refractive index. For example, for the YVO$_4$ crystal 16 that is employed in the second embodiment, a crystal plate is employed that is cut in a hexahedron having approximately 2.5 mm side in the x axis direction, approximately 2.4 mm length in the y axis direction, and approximately 0.9 mm thickness (plate thickness) in the z axis direction.

As shown in FIG. 5, the wavelength filter according to the second embodiment includes the YVO$_4$ crystal 16, the wave plate 100, and the polarizer 12. The wave plate 100 is sandwiched between the YVO$_4$ crystal 16 and the polarizer 12. The YVO$_4$ crystal 16 and the LN crystal 11 respectively cause a phase shift quantity δ in opposite direction to each other due to a change in the refractive index difference according to a temperature change. As a result, the wavelength filter cancels the change of the phase shift quantity δ, and reduces the changes of the reference wavelength according to the temperature change.

In the second embodiment, one surface of the YVO$_4$ crystal 16, the polarizer 12, and the wave plate 100 respectively are held by a metal holding member not shown, in a similar manner to that according to the first embodiment.

A laser beam having a polarization state (state shown in FIG. 3(A)) is first incident on the YVO$_4$ crystal 16 along a direction of the arrow mark shown in FIG. 5. Of the laser beam incident on the YVO$_4$ crystal 16, the beam component polarized in the a axis direction leads the one polarized in the c axis direction. Therefore, the polarization state of the laser beam changes when the beam passes through the YVO$_4$ crystal 16. The laser beam that has passed through the YVO$_4$ crystal 16 next passes through the wave plate 100, and the polarization state further changes based on the same principle as that of the wave plate 100 shown in the first embodiment. The phase shift quantity δ between the c axis direction and the a axis direction of the laser beam that passes through the YVO$_4$ crystal 16 and the wave plate 100 is expressed as $\delta=2\pi(\Delta n_A \cdot L_A + \Delta n_B \cdot L_B)/\lambda$, where $L_A$ is a plate thickness (i.e., a length of the YVO$_4$ crystal 16 in the laser beam propagation direction) of the YVO$_4$ crystal 16, $L_B$ is a plate thickness (i.e., a length of the LN crystal 11 in the laser beam propagation direction) of the LN crystal 11, $\Delta n_A$ is a difference between the refractive index of the c axis and that of the a axis of the YVO$_4$ crystal 16, and $\Delta n_B$ is a difference between the refractive index of the c axis and that of the a axis of the NL crystal 11. In this case, a variation of the wavelength according to a temperature becomes as shown in the following expression (1), where $\alpha_A$ is a coefficient of linear expansion of the YVO$_4$ crystal 16 in the laser beam propagation direction and $\alpha_B$ is a coefficient of linear expansion of the LN crystal 11 in the laser beam propagation direction.

$$\frac{\partial \lambda}{\partial T} = \left\{ \left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B \right\} \cdot \frac{\lambda}{\Delta n_A \cdot L_A + \Delta n_B \cdot L_B} \quad (1)$$

When the YVO$_4$ crystal 16 and the LN crystal 11 are processed so that the $L_A$ and $L_B$ satisfy the following expression (2), the right-hand side of the expression (1) becomes zero, so that the change of the wavelength due to the temperature change is theoretically cancelled.

$$\left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B = 0 \quad (2)$$

For example, when the ratio of the length of the YVO$_4$ crystal 16 in the laser beam propagation direction to that of the LN crystal 11 is $L_A:L_B \approx 6:1$, these crystals take a structure to mutually cancel the change of the Δn and L due to the temperature change respectively. Theoretically, the change of the phase shift quantity δ becomes zero in total. More specifically, when the plate thicknesses of the YVO$_4$ crystal 16 and the LN crystal 11 are $L_A$=0.9725 mm and $L_B$=0.1494 mm respectively, the expression (2) is satisfied by setting the characteristics of the respective materials as follows: $\Delta n_A$ 0.2039, $\Delta n_B$=−0.0731, $d\Delta n_A/dT$=−5.5[×10$^{-6}$/K], $d\Delta n_B/dT$=31.1[×10$^{-6}$/K], $\alpha_A$=4.5 [×10$^{-6}$/K], and $\alpha_B$=15.7 [×10$^{-6}$/K]. The plate thicknesses of the $L_A$ and $L_B$ are in the sizes that make it easy to structure the wavelength filter using these crystals. However, the wave plate 100 requires the LN crystal 11 whose the side surfaces parallel to the z axis direction are coated with the conductive adhesive 15 as shown in the first embodiment. This is because the LN crystal 11 has the pyroelectriclty and the piezoelectric effect. The inventors have found that this coating cause the wavelength filter to have stable filtering characteristics even when the filter temperature changes.

The YVO$_4$ crystal 16 causes spontaneous polarization, but not pyroelectric effect. Actually, according to the experiment carried out by the inventors, when the conductive adhesive 15 is coated on the side surfaces of the YVO$_4$ crystal 16 within a range of temperatures from about 10° C. to 60° C., substantially no influence of the pyroelectric effect is observed according to the temperature change. Therefore, when the wavelength filter is structured with the LN crystal 11 as a constituent member, it is not always necessary to coat the conductive adhesive on the side surfaces of the YVO$_4$ crystal 16 that are parallel to the z axis direction. Similarly, it is not always necessary to coat the conductive adhesive on the polarizer 12.

Figure 6:
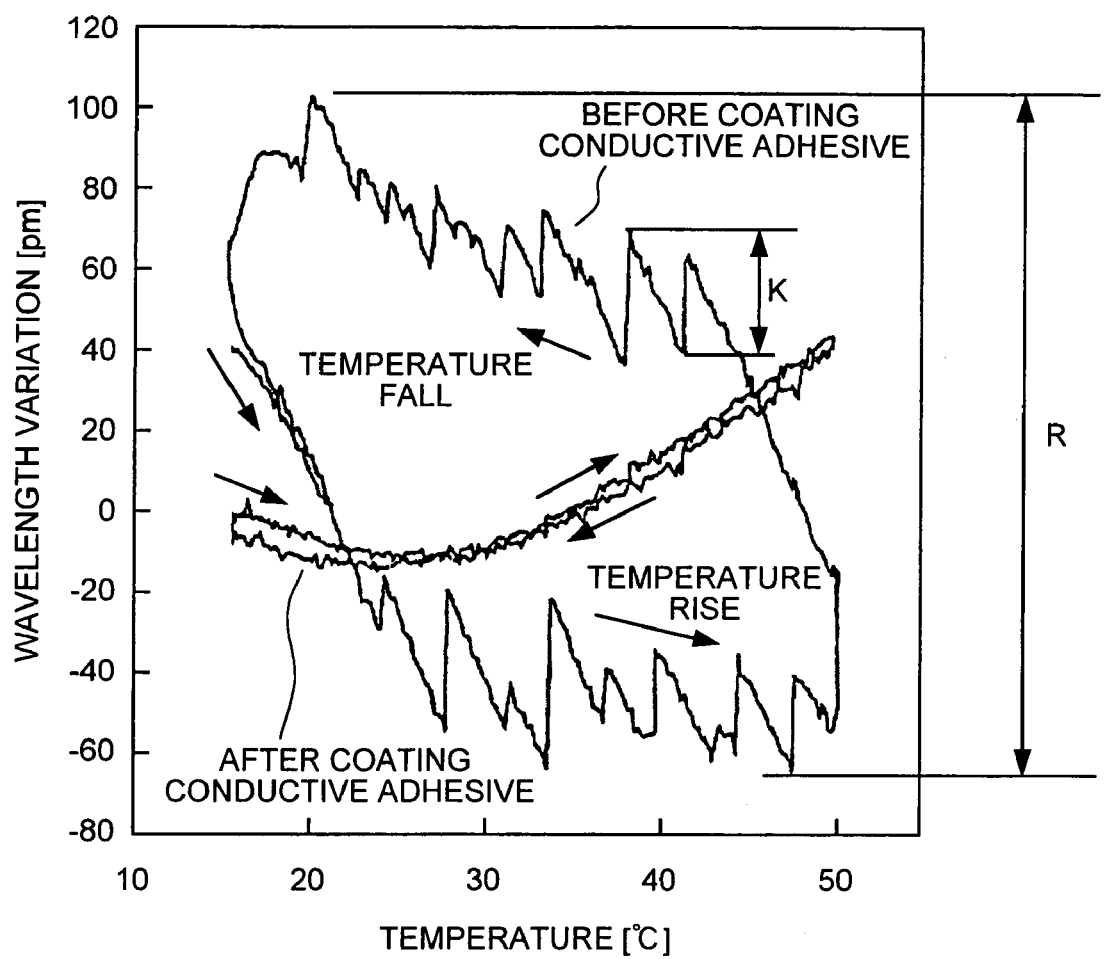
FIG. 6 shows temperature dependency characteristics of a wavelength in the wavelength filter of the second embodiment according to the present invention.

FIG. 6 shows a result of an experiment carried out to observe a change of wavelength discrimination characteristics due to a temperature change, for two cases: (a) when a wavelength filter is structured by coating (after coating) a conductive adhesive 15 on the side surfaces of the LN crystal 11 that are parallel to the z axis direction and disposing the YVO$_4$ crystal 16 in parallel, as shown in FIG. 5; and (b) when a wavelength filter is structured by not coating (before coating) a conductive adhesive 15 on the side surfaces of the LN crystal 11 and disposing the YVO$_4$ crystal 16 in parallel, in the same drawing.

According to the result of the experiment under the use of a semiconductor laser that stably emits a laser beam with a specific wavelength within a wavelength band from 1520 nm to 1620 nm, when the temperature of the wavelength filter is changed from 15° C. to 50° C., a wavelength variation becomes about 160 pm as a maximum, before coating the conductive adhesive 15 in the case (a). On the other hand, a wavelength variation becomes about 60 pm as a maximum, after coating the conductive adhesive 15 in the case (b). The wavelength variation of the former case becomes more than two times of the latter case.

When the conductive adhesive 15 is not coated in the case (a), the wavelength variation (variation width shown by arrow mark R in FIG. 6) becomes large along the temperature change of the wavelength filter. A skip of the detection wavelength (shown by the arrow mark K in FIG. 6) is observed in the size of 20 to 40 pm (picometers) which is considered to be due to the charge accumulation. The variation of the wavelength shows a hysteresis loop. On the other hand, when the conductive adhesive 15 is coated on the LN crystal 11 in the case (b), the wavelength variation becomes small as described above. Further, a skip of the detection wavelength or a hysteresis variation like the case of before coating the conductive adhesive 15 is not observed. Therefore, when the conductive adhesive 15 is coated on the side surfaces of the LN crystal 11 to make the surfaces conductive, it becomes possible to obtain more stable and highly-precise wavelength discrimination characteristics.

Based on the above, there is an effect that it is possible to obtain a wavelength filter that can reduce a variation of the wavelength that is monitored through a temperature change. As a result, even when the LN crystal 11 constitutes the wavelength filter, the wavelength filter can have wavelength discrimination characteristics for detecting a change of the intensity of the beam output from the wavelength filter according to the wavelength change, in higher precision with small dependency on temperature.

Figure 4:
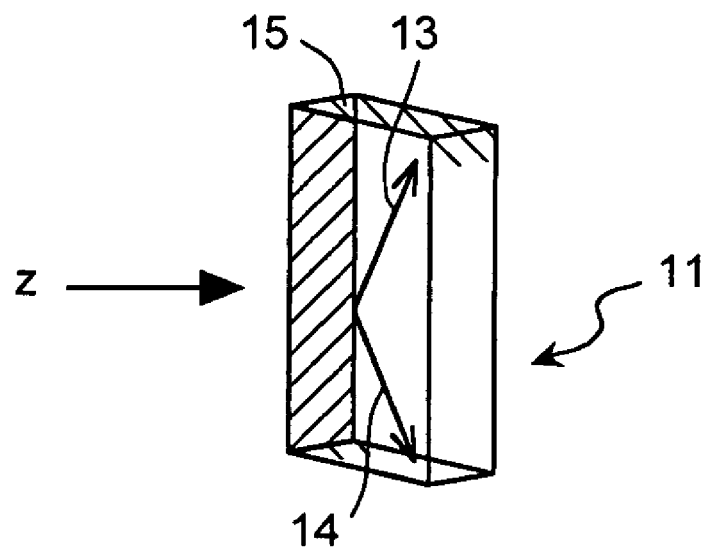
FIG. 4 shows other mode relating to a coating of a conductive adhesive on the wave plate of the first embodiment according to the present invention.
Figure 4:
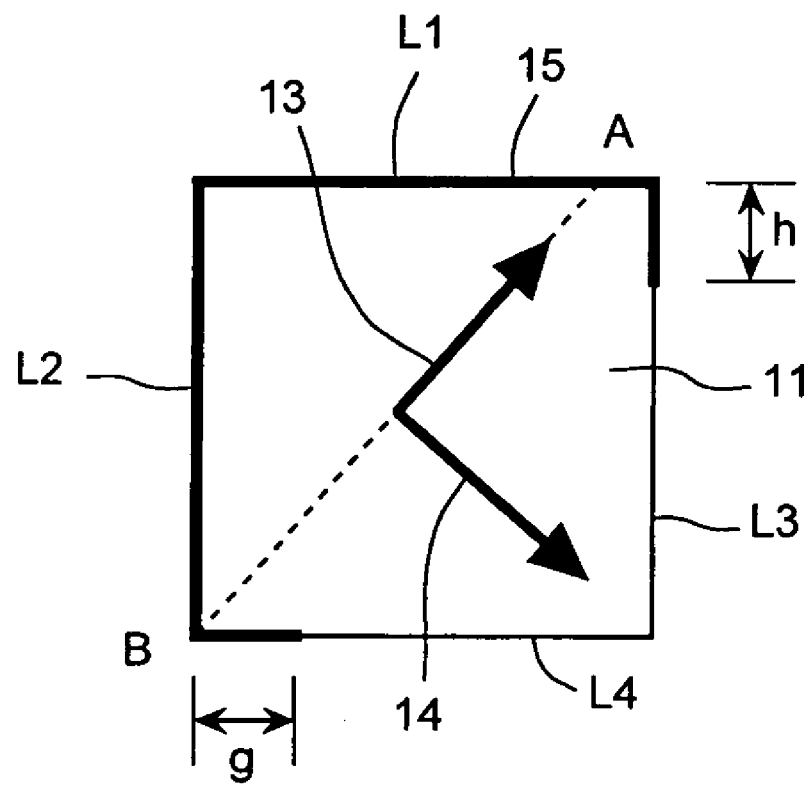

While the conductive adhesive 15 is coated on the whole periphery of the side surfaces of the LN crystal 11 that are parallel to the z axis direction, it is also possible to coat the conductive adhesive on only a part of the side surfaces parallel to the z axis direction. For example, as shown in FIG. 4, the conductive adhesive 15 may be coated on the surfaces that continuously connect between the two intersection points that intersect the c axis 13 (or the side surfaces that continuously connect between the two surfaces that intersect the c axis 13) so that the corner that sandwich the c axis direction become conductive. In this case, it is possible to suppress the charge accumulation in the c axis direction that has a large electro-optic effect. Consequently, there is a remarkable effect of suppressing the refractive index variation as compared with when the conductive adhesive 15 is not coated.

The conductive adhesive 15 is coated as means for making the side surfaces of the LN crystal 11 conductive. It is also possible to obtain a similar effect when the side surfaces of the LN crystal 11 are made conductive by providing a metallize coating on these surfaces. It is also possible to obtain a similar effect when the side surfaces are grounded.

While the LN crystal 11 is used for the wave plate 100 that constitutes the wavelength filter, it is also possible to employ the LiTaO$_3$ crystal that shows the same pyroelectricity. In this case, it is possible to obtain a similar effect when the side surfaces parallel to the z axis direction are made conductive. The LN crystal 11 and the YVO$_4$ crystal 16 used in the second embodiment are widely known as optical communication parts such as an isolator. It is easy to obtain these materials, and these materials are excellent in mass production.

Figure 7:
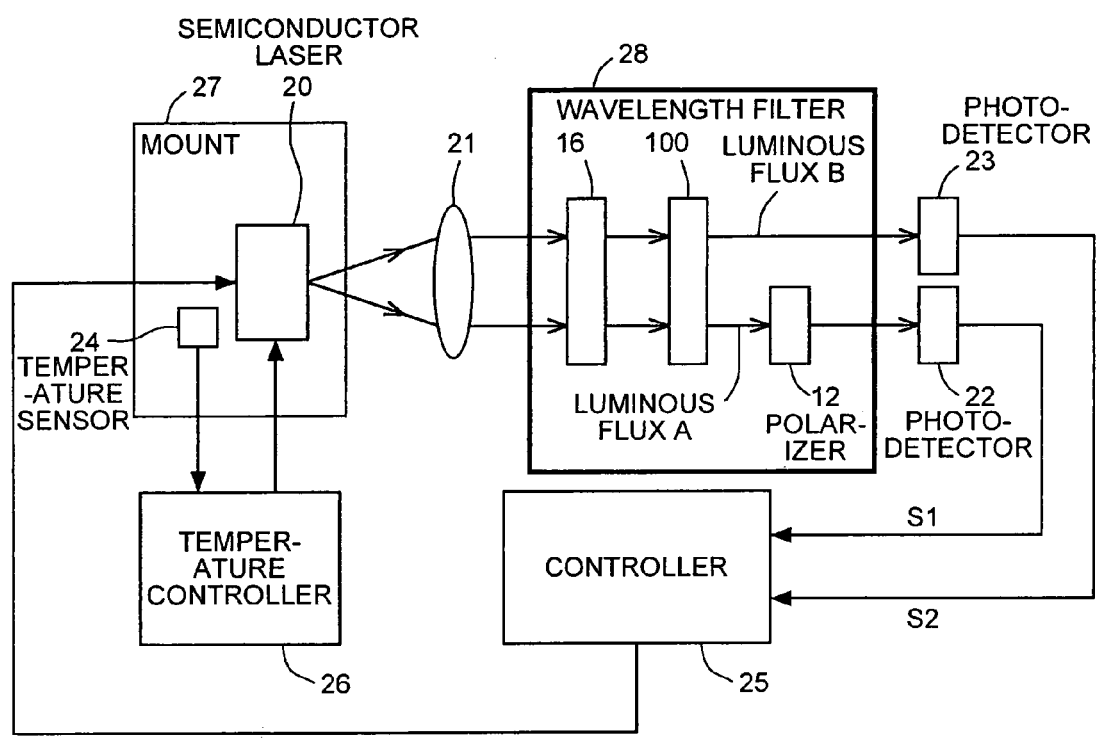
FIG. 7 shows a structure of a wavelength monitor of a third embodiment according to the present invention.

FIG. 7 is a schematic view that shows a structure of a wavelength monitor of a third embodiment according to the present invention. This wavelength monitor has a semiconductor laser 20 that emits laser beams from the front facet and the rear facet thereof, a lens 21 that condenses a laser beam emitted from the rear facet of the semiconductor laser 20, a first photodetector 22 that generates an electrical signal according to the intensity of the received beam, a second photodetector 23 that generates an electrical signal according to the intensity of the received beam, a temperature sensor 24 that outputs a signal according to a detected temperature, a controller 25 that adjusts an injection current to the semiconductor laser 20 based on outputs from the first and second photodetector 22 and 23 respectively, a temperature controller 26 that adjusts the temperature of the semiconductor laser 20 based on the output signal from the temperature sensor 24, a mount 27 on which the semiconductor laser 20 is mounted and the temperature sensor 24 is mounted in the vicinity of the semiconductor laser 20, and a wavelength filter 28 that changes the intensity of a transmitted beam depending on the wavelength of the laser beam.

The wavelength filter 28 includes the $YVO_4$ crystal 16, the wave plate 100, and the polarizer 12 to structure the wavelength filter similar to that according to the second embodiment. In the wavelength filter 28, the polarizer 12 has a size of approximately a half of the size of the $YVO_4$ crystal 16 and the wave plate 100 respectively, and is disposed at a position facing a lower half portion of the wave plate 100. The polarizer 12 is disposed at a position deviated from an optical path between the wave plate 100 and the second photodetector 23 such that a part of the beam passed through the wave plate 100 is directly incident on the second photodetector 23. The polarizer 12 is disposed on an optical path between the wave plate 100 and the potodetector 22.

The semiconductor laser 20 emits a laser beam in a lasing process. The lens 21 collimates the laser beam. The laser beam passes through the lens 21, and is incident on the $YVO_4$ crystal 16, which changes the polarization state of the incident laser beam. The laser beam passes through the $YVO_4$ crystal 16, and is incident on the wave plate 100, which further changes the polarization state of the incident laser beam. A part of the luminous flux (luminous flux A) of the laser beam that passes through the wave plate 100 passes through the polarizer 12, and is incident on the first photodetector 22. The first photodetector 22 outputs an electrical signal S1 according to the intensity of the incident beam. The other part of the luminous flux (luminous flux B) of the laser beam that passes through the wave plate 100 is not incident on (i.e. does not pass through) the polarizer 12 and is incident on the second photodetector 23.

The second photodetector 23 outputs an electrical signal S2 according to the intensity of the incident beam. The polarization state of the luminous flux A changes in a similar manner to that of the laser beam that passes through the $YVO_4$ crystal 16 and the wave plate 100 shown in FIG. 5. The intensity of the laser beam that passes through the polarizer 12 changes according to this polarization state. The polarization state of the luminous flux B changes in a similar manner to that of the laser beam that passes through the $YVO_4$ crystal 16 and the wave plate 100 shown in FIG. 5. The phase of the polarized output beam is shifted by δ from the polarization state of the laser beam that is incident on the $YVO_4$ crystal 16. In other words, the light intensity of the luminous flux A that passes through the polarizer 12 has a size that depends on the wavelength, and the light intensity of the luminous flux B that passes through the wave plate 100 does not depend on the wavelength of the incident laser beam.

Therefore, it is possible to obtain a wavelength monitor that monitors a change of the wavelength of the semiconductor laser 20 based on the electrical signal S1 output from the first photodetector 22 that measures the light quantity (intensity) of the beam that passes through the polarizer 12. Further, it is possible to measure the intensity of the laser beam output from the rear facet of the semiconductor laser 20 based on the electrical signal S2 output from the second photodetector 23.

When the signals S1 and S2 output from the first and second photodetectors 22 and 23 respectively are input to the controller 25, the controller 25 divides the intensity of the electrical signal S1 output from the first photodetector 22 by the intensity of the electrical signal S2 output from the second photoetector 23, thereby to measure the ratio S1 to S2 of the intensities of these signals. Based on a comparison between the measured ratio S1 to S2 of the intensities of the signals and a signal intensity ratio set in advance, the controller 25 decides whether the beam signal emitted from the semiconductor laser 20 is deviated from the reference wavelength to a short wavelength side, or whether the beam signal emitted from the semiconductor laser 20 is deviated from the reference wavelength to a long wavelength side. By obtaining the signal intensity ratio S1 to S2, the controller 25 removes the influence of the variation of the output beam from the semiconductor laser 20.

As a result of the decision made, when the beam signal emitted from the semiconductor laser 20 is deviated from the reference wavelength to the short wavelength side, the controller 25 increases the injection current (bias current) to the semiconductor laser, thereby to control the emission wavelength of the semiconductor laser to be long.

On the other hand, as a result of the decision made, when the beam signal emitted from the semiconductor laser 20 is deviated from the reference wavelength to the long wavelength side, the controller 25 decreases the injection current to the semiconductor laser 20, thereby to control the emission wavelength of the semiconductor laser 20 to be short.

The temperature controller 26 detects the temperature of the semiconductor laser 20 mounted on the mount 27, based on an output signal corresponding to the detection temperature from the temperature sensor 24. Based on the output signal from the temperature sensor 24, the temperature controller 26 controls the temperature of the semiconductor laser 20 by heating or cooling the mount on which the semiconductor laser 20 is mounted, with a Peltier element, such that the temperature of the semiconductor laser 20 becomes a desired temperature.

It is described in the above that the temperature of the semiconductor laser 20 is controlled by increasing or decreasing the injection current to the semiconductor laser 20. As a modification of the third embodiment, it is also possible to adjust the emission wavelength of the semiconductor laser, by adjusting the temperature of the semiconductor laser based on the signals S1 and S2 output from the first and second photodetectors 22 and 23 respectively. In this case, the controller 25 gives a control signal to the temperature controller 26 to adjust the temperature (fine adjustment of temperature) of the semiconductor laser 20 so as to stabilize the emission wavelength of the semiconductor laser 20 based on the intensity ratio S1 to S2 of the signals S1 and S2 output from the first and second photodetectors 22 and 23 respectively. In general, the wavelength of the semiconductor laser changes based on the temperature. The emission wavelength increases with an increase in the temperature. Therefore, when the controller 25 decides based on the signal intensity ratio S1 to S2 that the beam signal emitted from the semiconductor laser 20 is deviated from the reference wavelength to the short wavelength side, the temperature controller 26 adjusts the temperature of the semiconductor laser 20 to be high. On the other hand, when the controller 25 decides that the beam signal emitted from the semiconductor laser 20 is deviated from the reference wavelength to the long wavelength side, the temperature controller 26 adjusts the temperature of the semiconductor laser 20 to be low.

The temperature controller 26 has a larger control time constant than that of the controller 25 based on the output signal from the temperature sensor 24, thereby to adjust the temperature of the semiconductor laser 20 to a desired temperature (coarse adjustment of temperature).

As another modification of the controller 25, the controller 25 gives a control target signal (target temperature) to the temperature controller 26 to adjust the temperature of the semiconductor laser 20 so as to stabilize the emission wavelength of the semiconductor laser 20 based on the intensity ratio S1 to S2 of the signals S1 and S2 output from the first and second photodetectors 22 and 23 respectively. In this case, the wavelength of the semiconductor laser changes based on the temperature. The emission wavelength increases with an increase in the temperature. Therefore, when the controller 25 decides based on the signal intensity ratio S1 to S2 that the beam signal emitted from the semiconductor laser 20 is deviated from the reference wavelength to the short wavelength side, the target temperature of the temperature controller 26 is set so that the temperature becomes high. On the other hand, when the controller 25 decides that the beam signal emitted from the semiconductor laser 20 is deviated from the reference wavelength to the long wavelength side, the target temperature of the temperature controller 26 is set so that the temperature becomes low. Based on the output signal from the temperature sensor 24, the temperature controller 26 adjusts the temperature so that the temperature of the semiconductor laser 20 (output signal from temperature sensor 24) coincides with the target temperature (controller 25 has larger control time constant than that of temperature controller 26).

The wavelength monitor may structure a semiconductor module that couples a beam emitted from the front facet of the semiconductor laser 20 with an optical fiber, not shown, and transmits an output signal from the semiconductor laser 20 via the optical fiber.

It is of course possible to structure the wavelength monitor such that the wavelength monitor couples a beam emitted from the front facet of the semiconductor laser 20 with an optical fiber not shown, incidents the output signal from the semiconductor laser 20 to the wavelength filter 28 of the wavelength monitor via the optical fiber, and monitors the wavelength via the first and second photodetectors 22 and 23.

According to the third embodiment, there is an effect that it is possible to monitor the wavelength under a temperature change of the wavelength filter, based on stable and high wavelength discrimination characteristics, and that it is possible to stabilize the wavelength in high precision against the change in the environmental temperature of the wavelength monitor.

As explained above, according to the present invention, by applying a conductive adhesive to side surfaces of the LN crystal thereby to make the side surfaces conductive, it is possible to reduce the influence of environmental changes such as the pyroelectricity and like that occur due to a temperature change, without accumulation of charge on the side surfaces of the LN crystal. It is possible to obtain wavelength discrimination characteristics with higher stability.

INDUSTRIAL APPLICABILITY

The present invention is suitable for application to a wavelength monitor and a wave plate and a wavelength filter that are used in the wavelength monitor for a semiconductor laser as a light source used for wavelength division multiplexing communications and dense wavelength division multiplexing communications that employ an optical fiber.

The invention claimed is:

1. A wave plate made of any one of an $LiNbO_3$ crystal and an $LiTaO_3$ crystal and having a plurality of side surfaces, comprising:
   a conductor that is arranged on the side surfaces, wherein the side surfaces intersect an incident surface on which a laser beam is incident, and wherein the conductor suppressing charge accumulation in an axial direction of the crystal that has an electro-optic effect.

2. The wave plate according to claim 1, wherein the conductor is made of any one of a conductive adhesive and a metal.

3. The wave plate according to claim 1, further comprising:
   an anti-reflection coating that is arranged on any one of the incident surface and an outgoing surface facing the incident surface.

4. A wave plate made of any one of an $LiNbO_3$ crystal and an $LiTaO_3$ crystal and having a plurality of side surfaces, comprising:
   a conductor that is arranged on the side surfaces, and wherein the conductor suppressing charge accumulation in an axial direction of the crystal that has an electro-optic effect, wherein
   the side surfaces intersect an incident surface on which a laser beam is incident, and
   the wave plate is disposed at any one of the front and the back of other plate made of a $YVO_4$ crystal, in the incident direction of the laser beam.

5. The wave plate according to claim 4, further comprising:
   an anti-reflection coating that is arranged on any one of the incident surface and an outgoing surface facing the incident surface.

6. A wave plate made of any one of an $LiNbO_3$ crystal and an $LiTaO_3$ crystal and having a plurality of surfaces, comprising:
   a conductor that is arranged on the surfaces, wherein the surfaces intersect an optical axis of the wave plate, and wherein the conductor suppressing charge accumulation in an axial direction of the crystal that has an electro-optic effect.

7. The wave plate according to claim 6, wherein the optical axis is approximately orthogonal to an incident direction of a laser beam that is incident on the wave plate, and is inclined by approximately 45 degrees from a polarization direction of the laser beam.

8. The wave plate according to claim 6, wherein the conductor is arranged on at least side surfaces that continuously connect between two intersection points at which the surfaces intersect the optical axis.

9. The wave plate according to claim 6, wherein the conductor is made of any one of a conductive adhesive and a metal.

10. The wave plate according to claim 6, wherein the wave plate is disposed at any one of the front and the back of other plate made of a YVO$_4$ crystal, in the incident direction of the laser beam.

11. A wavelength filter comprising:
the wave plate according to claim 1; and
a polarizer that is disposed on an optical path of the laser beam.

12. A wavelength filter comprising:
the wave plate according to claim 4; and
a polarizer that is disposed on an optical path of the laser beam.

13. A wavelength monitor comprising:
the wave plate according to claim 1;
a photodetector that is disposed on an optical path of the laser beam and that outputs a signal corresponding to the laser beam; and
a polarizer that is disposed between the wave plate and the photodetector on the optical path.

14. A wavelength monitor comprising:
a semiconductor laser;
the wave plate according to claim 1 through which a laser beam output from the semiconductor laser passes;
a photodetector that is disposed on an optical path of the laser beam passing through the wave plate, and that outputs a signal corresponding to the laser beam; and
a polarizer that is disposed between the wave plate and the photodetector on the optical path.

15. A wavelength monitor comprising:
a semiconductor laser;
the wave plate according to claim 1 through which a laser beam output from the semiconductor laser passes;
a first photodetector that is disposed on an optical path of the laser beam passing through the wave plate, and that outputs a signal corresponding to the laser beam on the optical path;
a second photodetector that is disposed on other optical path of the laser beam passing through the wave plate, and that outputs a signal corresponding to the laser beam on the other optical path; and
a polarizer that is disposed on the optical path between the wave plate and the first photodetector, and that is disposed with a deviation from the other optical path between the wave plate and the second photodetector.

16. A wavelength monitor comprising:
a semiconductor laser;
the wave plate according to claim 1 through which a laser beam output from the semiconductor laser passes;
a photodetector that is disposed on an optical path of the laser beam passing through the wave plate, and that outputs a signal corresponding to the laser beam;
a polarizer that is disposed between the wave plate and the photodetector on the optical path; and
a controller that adjusts any one of a temperature of the semiconductor laser, a temperature of a mount on which the semiconductor laser is mounted, and an injection current to the semiconductor laser, based on the signal output from the photodetector.

17. A wavelength monitor comprising:
the wave plate according to claim 4;
a photodetector that is disposed on an optical path of the laser beam passing through the wave plate, and that outputs a signal corresponding to the laser beam; and
a polarizer that is disposed between the wave plate and the photodetector on the optical path.

18. A wavelength monitor comprising:
a semiconductor laser;
the wave plate according to claim 4 through which a laser beam output from the semiconductor laser passes;
a photodetector that is disposed on an optical path of the laser beam passing through the wave plate, and that outputs a signal corresponding to the laser beam; and
a polarizer that is disposed between the wave plate and the photodetector on the optical path.

19. A wavelength monitor comprising:
a semiconductor laser;
the wave plate according to claim 4 through which a laser beam output from the semiconductor laser passes;
a first photodetector that is disposed on an optical path of the laser beam passing through the wave plate, and that outputs a signal corresponding to the laser beam on the optical path;
a second photodetector that is disposed on other optical path of the laser beam passing through the wave plate, and that outputs a signal corresponding to the laser beam on the other optical path; and
a polarizer that is disposed on the optical path between the wave plate and the first photodetector, and that is disposed with a deviation from the other optical path between the wave plate and the second photodetector.

20. A wavelength monitor comprising:
a semiconductor laser;
the wave plate according to claim 4 through which a laser beam output from the semiconductor laser passes;
a photodetector that is disposed on an optical path of the laser beam passing through the wave plate, and that outputs a signal corresponding to the laser beam;
a polarizer that is disposed between the wave plate and the photodetector on the optical path; and
a controller that adjusts any one of a temperature of the semiconductor laser, a temperature of a mount on which the semiconductor laser is mounted, and an injection current to the semiconductor laser, based on the signal output from the photodetector.

21. The wave plate according to claim 1, wherein the conductor is made of Ag.

22. The wave plate according to claim 4, wherein the conductor is made of Ag.

23. The wave plate according to claim 6, wherein the conductor is made of Ag.

24. The wave plate according to claim 1, wherein the conductor is made of Ni—Au.

25. The wave plate according to claim 4, wherein the conductor is made of Ni—Au.

26. The wave plate according to claim 6, wherein the conductor is made of Ni—Au.

* * * * *